(12) United States Patent
Lee et al.

(10) Patent No.: US 10,158,000 B2
(45) Date of Patent: Dec. 18, 2018

(54) LOW-K DIELECTRIC SIDEWALL SPACER TREATMENT

(71) Applicant: Taiwan Semiconductor Manufacturing Company Limited, Hsinchu (TW)

(72) Inventors: Wei-Yang Lee, Taipei (TW); Chia-Chun Lan, Tainan (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 14/089,879

(22) Filed: Nov. 26, 2013

(65) Prior Publication Data
US 2015/0145073 A1 May 28, 2015

(51) Int. Cl.
*H01L 29/66* (2006.01)
*H01L 21/28* (2006.01)
*H01L 29/49* (2006.01)
*H01L 29/51* (2006.01)

(52) U.S. Cl.
CPC .... *H01L 29/6656* (2013.01); *H01L 21/28247* (2013.01); *H01L 29/4983* (2013.01); *H01L 29/6653* (2013.01); *H01L 29/4966* (2013.01); *H01L 29/517* (2013.01); *H01L 29/66545* (2013.01)

(58) Field of Classification Search
CPC ............. H01L 29/6656; H01L 29/4966; H01L 29/517; H01L 29/512; H01L 21/823864
See application file for complete search history.

(56) References Cited

U.S. PATENT DOCUMENTS

| | | | | |
|---|---|---|---|---|
| 5,899,721 A * | 5/1999 | Gardner et al. | ............... | 438/303 |
| 6,228,731 B1 * | 5/2001 | Liaw et al. | ................... | 438/303 |
| 2002/0102430 A1 * | 8/2002 | Shirahata | .......... | H01L 21/28247 |
| | | | | 428/629 |
| 2003/0178688 A1 * | 9/2003 | Yang et al. | .................... | 257/395 |
| 2005/0026380 A1 * | 2/2005 | Kammler | .............. | H01L 29/665 |
| | | | | 438/305 |
| 2005/0082605 A1 * | 4/2005 | Akasaka | .......... | H01L 21/823842 |
| | | | | 257/329 |
| 2006/0151776 A1 * | 7/2006 | Hatada et al. | ................... | 257/19 |
| 2007/0090417 A1 * | 4/2007 | Kudo | ............................. | 257/288 |
| 2007/0202641 A1 * | 8/2007 | Wei et al. | ..................... | 438/194 |
| 2007/0238268 A1 * | 10/2007 | Leusink | .............. | H01L 21/0214 |
| | | | | 438/478 |
| 2008/0029834 A1 * | 2/2008 | Sell | .............................. | 257/411 |
| 2008/0124814 A1 * | 5/2008 | Kumar | .............. | H01L 27/10873 |
| | | | | 438/4 |
| 2008/0237726 A1 * | 10/2008 | Dyer | ............................. | 257/369 |

(Continued)

Primary Examiner — Bitew A Dinke
(74) Attorney, Agent, or Firm — Jones Day

(57) ABSTRACT

Systems and methods are provided for fabricating a semiconductor structure including sidewall spacers. An example semiconductor structure includes: a gate structure, a first sidewall spacer, and a second sidewall spacer. The gate structure is formed over a substrate. The first sidewall spacer is adjacent to the gate structure, a top part of the first sidewall spacer including a first dielectric material, a bottom part of the first sidewall spacer including a second dielectric material. The second sidewall spacer is adjacent to the first sidewall spacer, the second sidewall spacer including a third dielectric material.

18 Claims, 10 Drawing Sheets

(56) References Cited

U.S. PATENT DOCUMENTS

| | | | |
|---|---|---|---|
| 2009/0134477 A1* | 5/2009 | Kim | H01L 21/28035 257/408 |
| 2009/0256214 A1* | 10/2009 | Sun | H01L 21/76897 257/411 |
| 2010/0240186 A1* | 9/2010 | Wang | 438/285 |
| 2010/0252868 A1* | 10/2010 | Allen | H01L 29/1033 257/288 |
| 2011/0117712 A1* | 5/2011 | Muralidhar | H01L 29/4983 438/287 |
| 2011/0156107 A1* | 6/2011 | Bohr | H01L 21/76831 257/288 |
| 2011/0221012 A1* | 9/2011 | Bu et al. | 257/411 |
| 2011/0284935 A1* | 11/2011 | Yamada | H01L 21/76897 257/288 |
| 2012/0003806 A1* | 1/2012 | Wang | 438/305 |
| 2012/0058618 A1* | 3/2012 | Hayashi | 438/287 |
| 2012/0153398 A1* | 6/2012 | Baars et al. | 257/369 |
| 2012/0161251 A1* | 6/2012 | Haverty et al. | 257/411 |
| 2012/0223364 A1* | 9/2012 | Chung et al. | 257/192 |
| 2012/0264286 A1* | 10/2012 | Yeo | 438/595 |
| 2013/0023094 A1* | 1/2013 | Yeh | H01L 21/823807 438/218 |
| 2013/0075833 A1* | 3/2013 | Liu | H01L 21/28079 257/411 |
| 2013/0181259 A1* | 7/2013 | Rao | H01L 29/6656 257/288 |
| 2013/0292774 A1* | 11/2013 | Hoentschel et al. | 257/368 |
| 2013/0295767 A1* | 11/2013 | Scheiper | H01L 21/823807 438/682 |
| 2014/0021517 A1* | 1/2014 | Cheng | H01L 29/6656 257/288 |
| 2014/0087535 A1* | 3/2014 | Roh et al. | 438/285 |
| 2014/0167121 A1* | 6/2014 | Yeo et al. | 257/288 |
| 2014/0273377 A1* | 9/2014 | Kim | 438/283 |
| 2014/0369115 A1* | 12/2014 | Kim et al. | 365/182 |
| 2015/0014788 A1* | 1/2015 | Park et al. | 257/401 |
| 2015/0035063 A1* | 2/2015 | Faul | H01L 27/088 257/368 |
| 2015/0084102 A1* | 3/2015 | Park | H01L 29/785 257/288 |
| 2015/0102416 A1* | 4/2015 | Yin | H01L 21/823842 257/369 |

\* cited by examiner

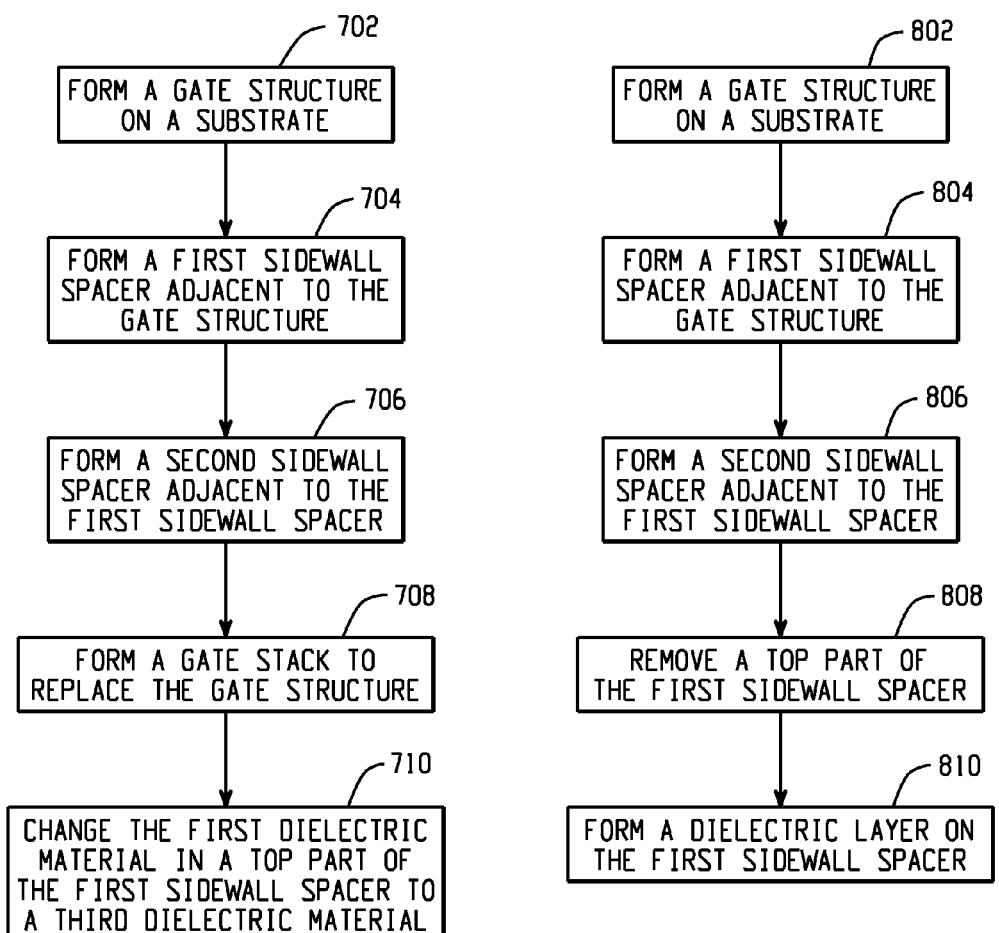

LOW-K DIELECTRIC SIDEWALL SPACER TREATMENT

FIELD

The technology described in this disclosure relates generally to material processing and more particularly to semiconductor device fabrication.

BACKGROUND

As dimensions of semiconductor devices continue to decrease and packaging densities continue to increase, parasitic capacitance becomes more and more important to improve the operating speed of devices (e.g., transistors). For example, a gate structure of a transistor usually includes one or more sidewall spacers positioned adjacent to the gate structure. The sidewall spacers are used to define the gate cavity in a replacement gate manufacturing process and to protect a final replacement gate structure. Oftentimes, the sidewall spacers are made of silicon nitride which has a relatively high dielectric constant value (i.e., a high k value) of, e.g., about 7-8. As a result of the transistor structure, the high-k silicon nitride spacers usually tend to increase the parasitic capacitance between the gate electrode and self-alighted contacts on source/drain regions of the transistor, which often reduces the switching speed of the transistor. Thus, low-k dielectric materials (e.g., k<6) are sometimes implemented to fabricate sidewall spacers in order to improve the transistor performance.

SUMMARY

In accordance with the teachings described herein, systems and methods are provided for fabricating a semiconductor structure including sidewall spacers. An example semiconductor structure includes: a gate structure, a first sidewall spacer, and a second sidewall spacer. The gate structure is formed over a substrate. The first sidewall spacer is adjacent to the gate structure, a top part of the first sidewall spacer including a first dielectric material, a bottom part of the first sidewall spacer including a second dielectric material. The second sidewall spacer is adjacent to the first sidewall spacer, the second sidewall spacer including a third dielectric material.

In one embodiment, a method is provided for fabricating a semiconductor structure including sidewall spacers. A gate structure is formed over a substrate. A first sidewall spacer is formed adjacent to the gate structure, the first sidewall spacer including a first dielectric material. A second sidewall spacer is formed adjacent to the first sidewall spacer, the second sidewall spacer including a second dielectric material. A gate stack is formed to replace the gate structure. The first dielectric material in a top part of the first sidewall spacer is changed to a third dielectric material.

In another embodiment, a method is provided for fabricating a semiconductor structure including sidewall spacers. A gate structure is formed over a substrate. A first sidewall spacer is formed adjacent to the gate structure, the first sidewall spacer including a first dielectric material. A second sidewall spacer is formed adjacent to the first sidewall spacer, the second sidewall spacer including a second dielectric material. A top part of the first sidewall spacer is removed. A dielectric layer is formed over the first sidewall spacer, the dielectric layer including a third dielectric material.

BRIEF DESCRIPTION OF THE DRAWINGS

FIG. 7 depicts an example flow chart for fabricating a semiconductor structure including sidewall spacers.

FIG. 8 depicts another example flow chart for fabricating a semiconductor structure including sidewall spacers.

DETAILED DESCRIPTION

Figure 1:
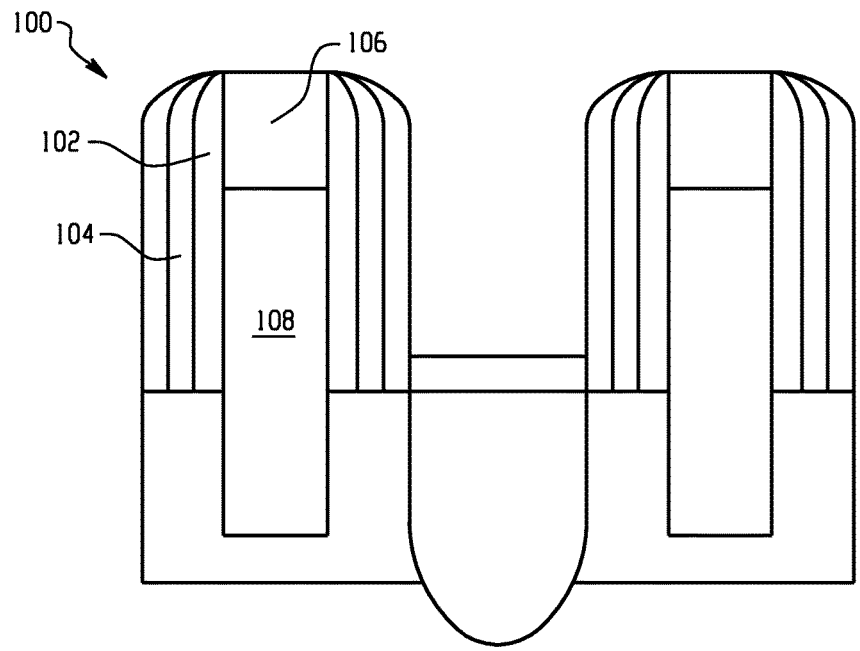
FIG. 1 depicts an example diagram showing sidewall spacers in a semiconductor structure.

FIG. 1 depicts an example diagram showing sidewall spacers in a semiconductor structure. As shown in FIG. 1, two sidewall spacers 102 and 104 are positioned adjacent to a gate structure 108 over which a sacrificial layer 106 is formed. For example, the inner sidewall spacer 102 includes silicon-oxygen-carbon-nitride (i.e., SiOCN) which has a low dielectric constant value (i.e., a low k value), and the outer sidewall spacer 104 includes silicon-carbon-nitride (i.e., SiCN) or silicon nitride. In order to fabricate transistors, the semiconductor structure 100 needs to undergo one or more middle-end-of-line (MEOL) etching processes. However, the sidewall spacer 102 that includes SiOCN often reacts with etchants during the etching processes, which causes the quality of the sidewall spacer 102 to degrade. For example, cracking and/or delamination appear in the sidewall spacer 102.

Figure 2:
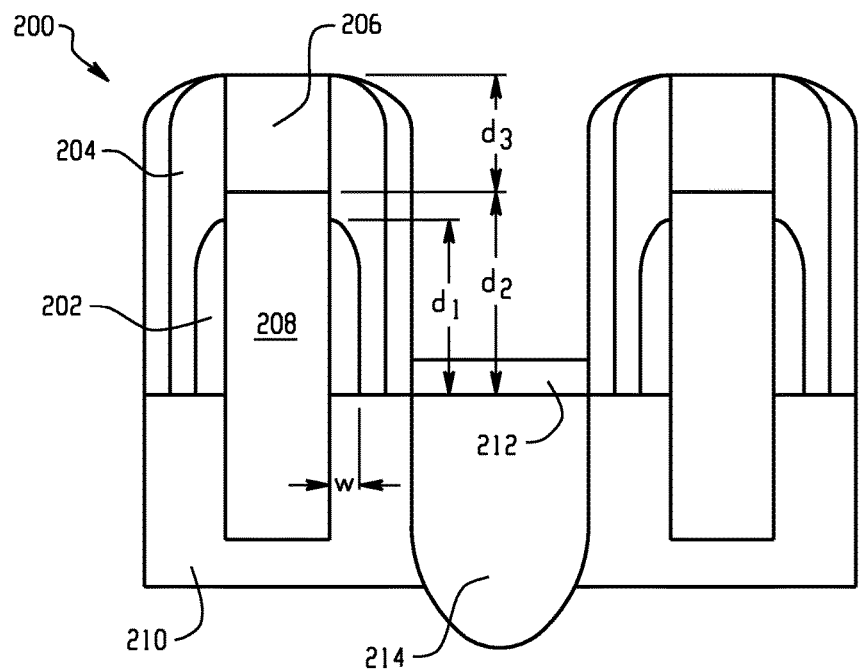
FIG. 2 depicts another example diagram showing side spacers in a semiconductor structure.

FIG. 2 depicts another example diagram showing side spacers in a semiconductor structure. As shown in FIG. 2, two sidewall spacers 202 and 204 are positioned adjacent to a gate structure 208 over which a sacrificial layer 206 is formed. The inner sidewall spacer 202 (e.g., SiOCN) has a reduced height compared with the sidewall spacer 102. The outer sidewall spacer 204 (e.g., SiCN or silicon nitride) extends over the inner sidewall spacer 102, and protects, together with the sacrificial layer 206, the inner sidewall spacer 102 from reacting with etchants during one or more subsequent etching processes.

For example, a seal spacer (not shown) is disposed between the gate structure 208 and the sidewall spacer 202. In some embodiments, the sidewall spacer 202 has a height (e.g., d1) in a range of about 15 nm to about 25 nm, and a width (e.g., w) in a range of about 2 nm to about 5 nm. The gate structure 208 has a gate height (e.g., d2) in a range of about 25 nm to about 50 nm. The sacrificial layer 206 has a height (e.g., d3) in a range of about 10 nm to about 30 nm.

In certain embodiments, the gate structure 208 includes a gate stack that contains an interfacial layer, a high-k dielectric layer, and a gate electrode. For example, the interfacial layer includes silicon oxide, or other suitable materials. The high-k dielectric layer includes tantalum oxide, hafnium oxide, zirconium oxide, titanium oxide, aluminum oxide, hafnium silicates, hafnium dioxide-alumina alloy, or other suitable materials. The gate electrode includes titanium, titanium nitride, titanium-aluminum, aluminum, aluminum nitride, tantalum, tantalum nitride, tantalum carbide, tantalum carbonitride, tantalum silicon nitride, tantalum silicide, or other suitable materials. In some embodiments, the gate structure 208 includes a polysilicon dummy gate structure. The gate structure 208 and a junction 214 (e.g., epitaxially grown) are formed over a substrate 210, and a contact-etching-stop layer (CESL) 212 (e.g., silicon nitride) is formed over the junction 214. For example, the junction 214 is n-doped or p-doped.

Figure 3A:
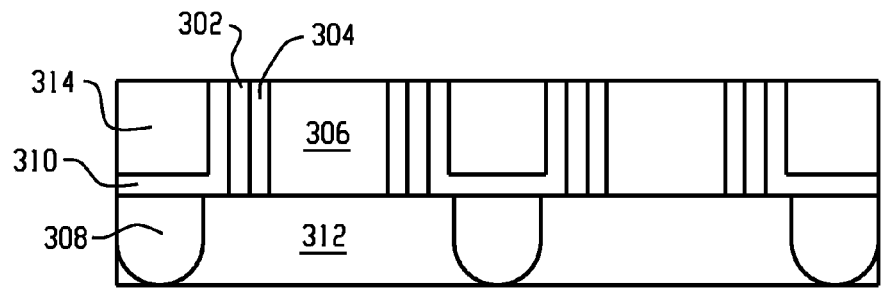
FIG. 3(a)-FIG. 3(h) depict example diagrams for fabricating a semiconductor structure including sidewall spacers according to some embodiments.

FIG. 3(a)-FIG. 3(h) depict example diagrams for fabricating a semiconductor structure including sidewall spacers according to some embodiments. As shown in FIG. 3(a), a seal spacer 302 (e.g., SiCN or silicon nitride) is formed over a substrate 312 (e.g., silicon) and is adjacent to a sidewall spacer 304 (e.g., SiOCN) that is formed next to a dummy polysilicon structure 306. A contact-etching-stop layer (CESL) 310 is formed over a junction 308. An inter-layer dielectric layer 314 is formed over the CESL 310. For example, the junction 308 is used for a source/drain region of a transistor.

Figure 3B:
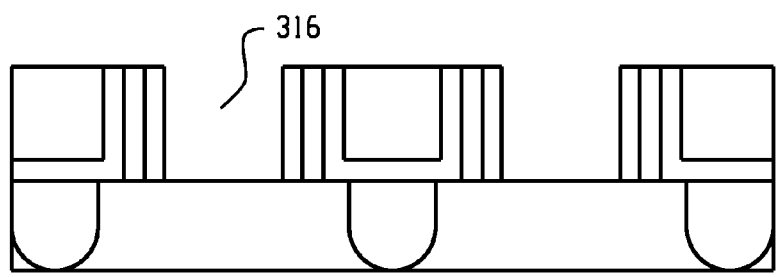
Figure 3C:
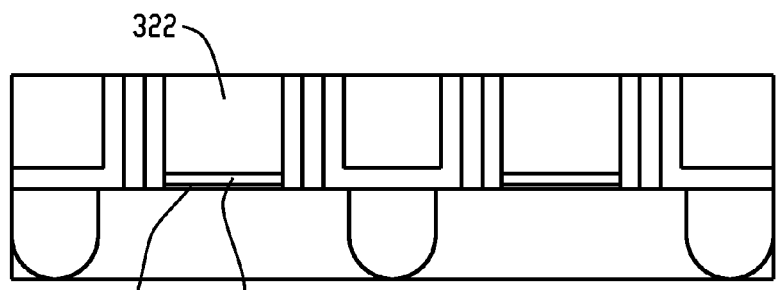
Figure 3D:
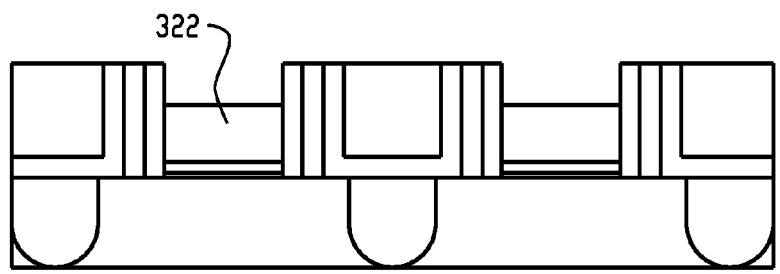

As shown in FIG. 3(b), the dummy polysilicon structure 306 is removed (e.g., through etching) to form a gate cavity 316. Then, a gate stack including an interfacial layer 318 (e.g., silicon oxide), a high-k dielectric layer 320 (e.g., hafnium oxide), and a gate electrode 322 (e.g., metal-based materials) is formed in the gate cavity 320, as shown in FIG. 3(c). An etching process is performed to reduce the height of the gate electrode 322, as shown in FIG. 3(d).

Figure 3E:
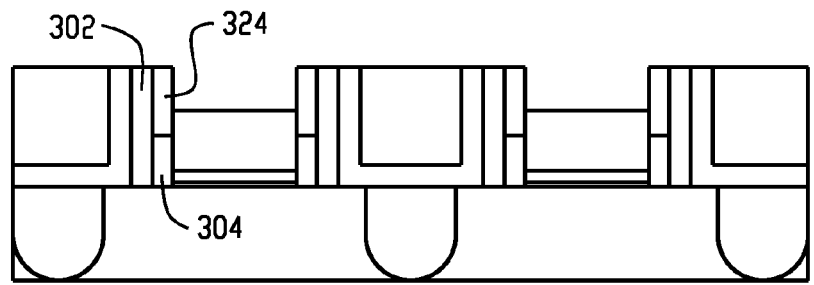

Then, a nitridation process is carried out. A top part of the sidewall spacer 304 (e.g., SiOCN) is transformed to a different dielectric material 324 (e.g., SiCN or silicon nitride) as a result of the nitridation process, as shown in FIG. 3(e). In some embodiments, the nitridation process corresponds to a thermal nitridation process. For example, under a pressure (e.g., 760 Torr), the thermal nitridation is performed at a certain temperature (e.g., in a range of about 700° C. to about 1000° C.) for a particular time period (e.g., in a range of about 10 seconds to about 100 seconds). In certain embodiments, the nitridation process corresponds to a plasma nitridation process. For example, a $N_2/NH_3$ plasma generates N radicals which replace 0 in SIOCN (e.g., through ion bombardment) to form silicon nitride or SiCN. The plasma nitridation is carried out at a room temperature with a certain power (e.g., in a range of about 20 W to about 200 W) for a particular time period (e.g., in a range of about 10 seconds to about 100 seconds). As an example, an effective depth associated with the nitridation is in a range of about 25 nm to about 35 nm.

Figure 3F:
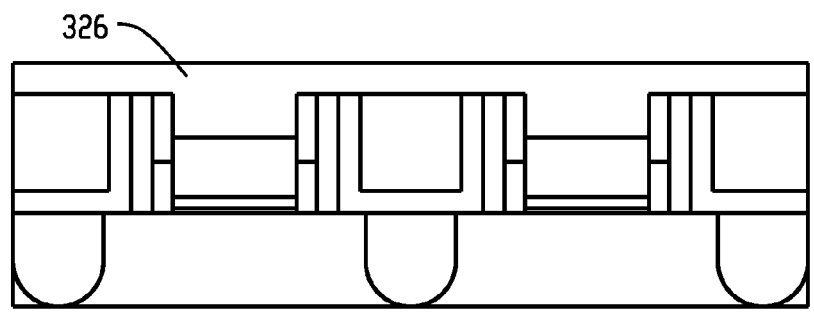
Figure 3G:
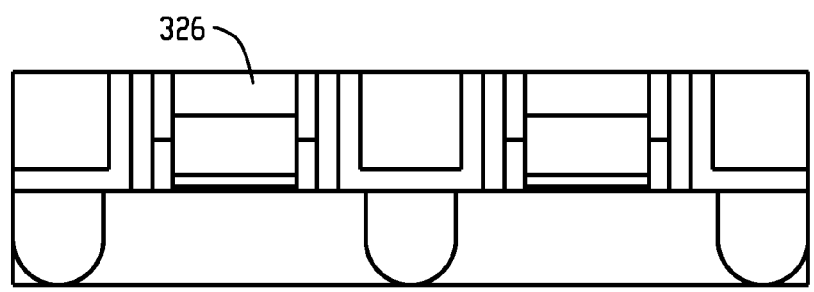
Figure 3H:
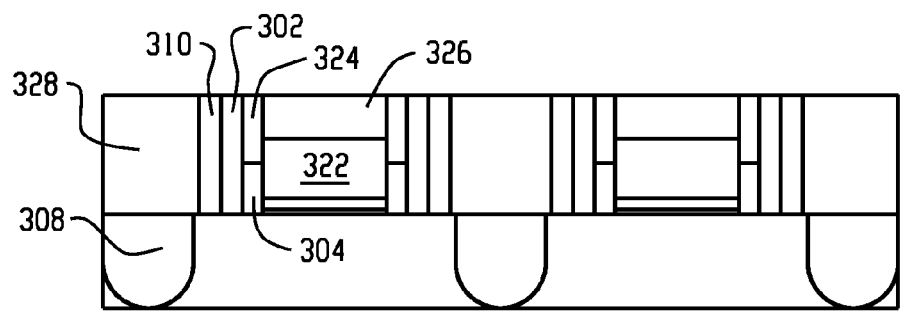

A sacrificial layer 326 (e.g., silicon nitride) is formed, as shown in FIG. 3(f). A chemical-mechanical planarization (CMP) process is performed to remove part of the sacrificial layer 326, as shown in FIG. 3(g). Then, a self-aligned-contact process is carried out to form one or more contacts 328 over source/drain regions of transistors, as shown in FIG. 3(h). For example, the self-aligned-contact process includes a photolithography process to define the contacts, a recess process to generate contact cavities, and a filling process to deposit conductive materials (e.g., metal-based materials) into the contact cavities.

Figure 4A:
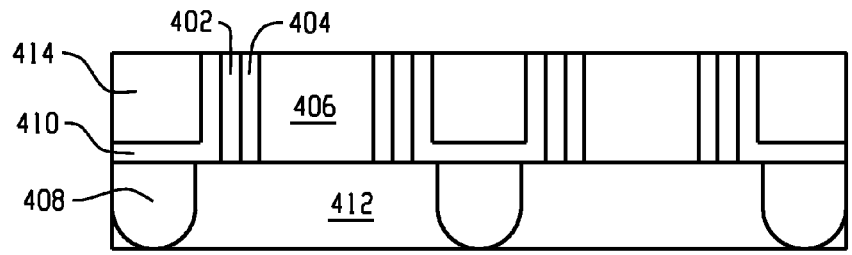
FIG. 4(a)-FIG. 4(i) depict example diagrams for fabricating a semiconductor structure including sidewall spacers according to certain embodiments.

Alternatively, the nitridation process is performed at a different stage during the fabrication process. FIG. 4(a)-FIG. 4(i) depict example diagrams for fabricating a semiconductor structure including sidewall spacers according to certain embodiments. As shown in FIG. 4(a), a sidewall spacer 404 (e.g., SiOCN) is positioned adjacent to a seal spacer 402 (e.g., SiCN or silicon nitride). A dummy polysilicon structure 406 is formed over a substrate 412 (e.g., silicon). An inter-layer dielectric layer 414 is formed over a CESL 410 that is formed over a junction 408 (e.g., n-doped or p-doped).

Figure 4B:
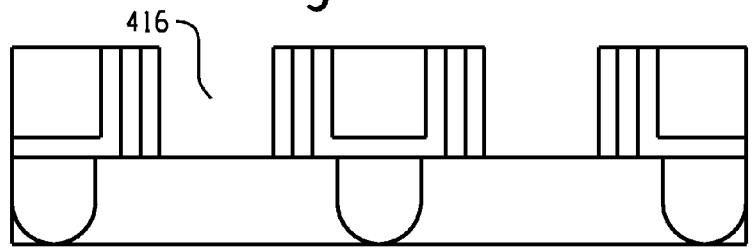
Figure 4C:
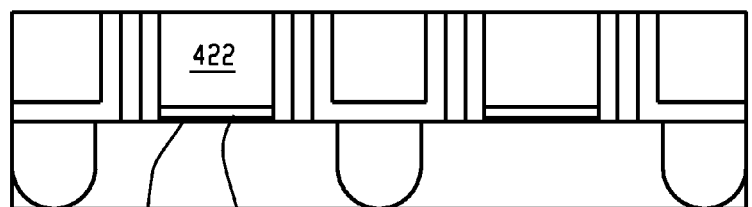
Figure 4D:
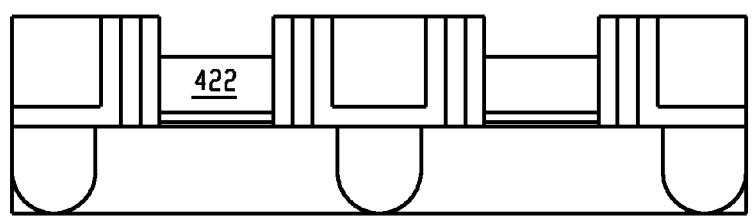

As shown in FIG. 4(b), the dummy polysilicon structure 406 is removed (e.g., through etching) to form a gate cavity 416. Then, a gate stack including an interfacial layer 418 (e.g., silicon oxide), a high-k dielectric layer 420 (e.g., hafnium oxide), and a gate electrode 422 (e.g., metal-based materials) is formed in the gate cavity 416, as shown in FIG. 4(c). An etching process is performed to reduce the height of the gate electrode 422, as shown in FIG. 4(d).

Figure 4E:
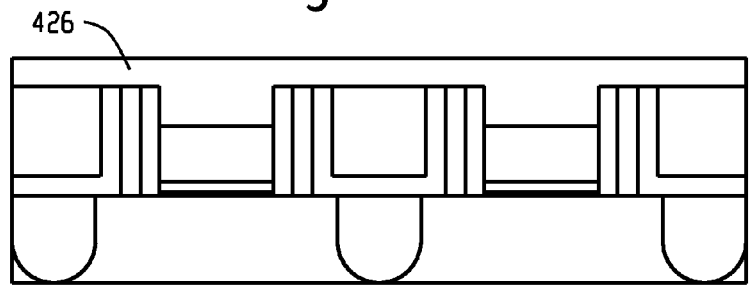
Figure 4F:
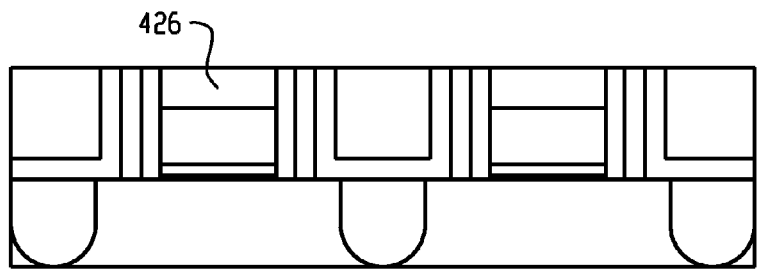
Figure 4G:
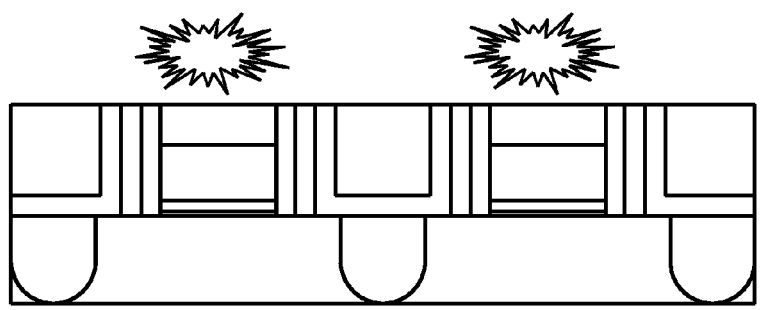
Figure 4H:
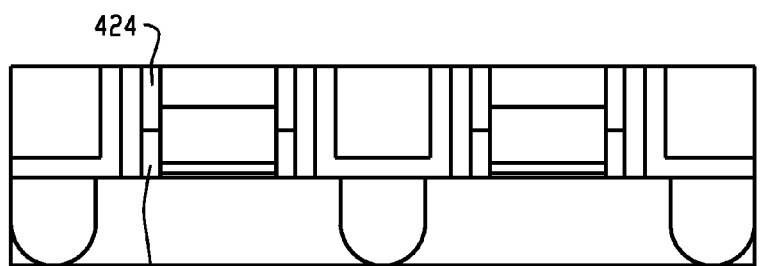
Figure 4I:
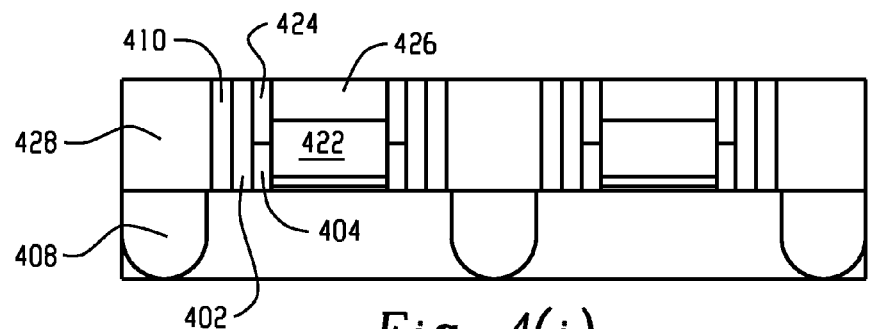

A sacrificial layer 426 (e.g., silicon nitride) is formed, as shown in FIG. 4(e). A CMP process is performed to remove part of the sacrificial layer 426, as shown in FIG. 4(f). Then, a nitridation process (e.g., thermal nitridation, plasma nitridation, or other suitable nitridation processes) is carried out, as shown in FIG. 4(g). A top part of the sidewall spacer 404 (e.g., SiOCN) is transformed to a different dielectric material 424 (e.g., SiCN or silicon nitride) as a result of the nitridation process, as shown in FIG. 4(h). Then, a self-aligned-contact process is carried out to form one or more contacts 428 over source/drain regions of transistors, as shown in FIG. 4(i).

Figure 5A:
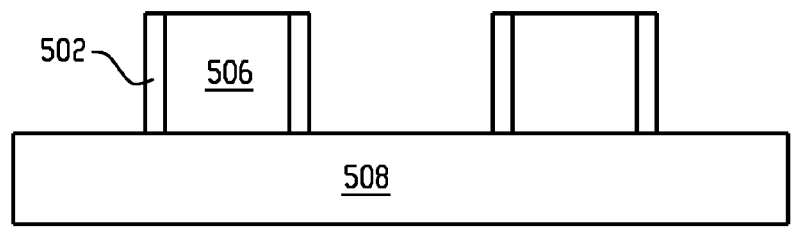
FIG. 5(a)-FIG. 5(g) depict example diagrams for fabricating a semiconductor structure including sidewall spacers according to some embodiments.
Figure 5B:
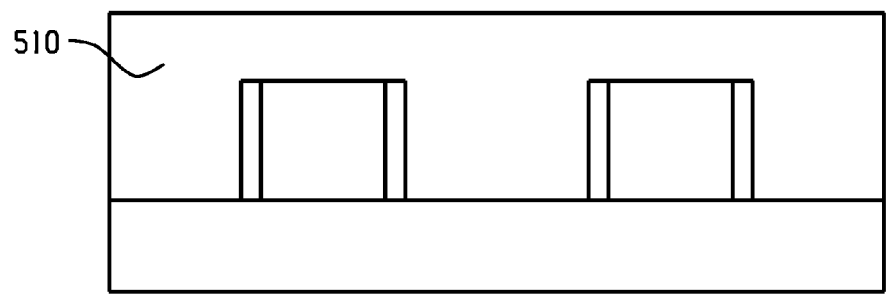
Figure 5C:
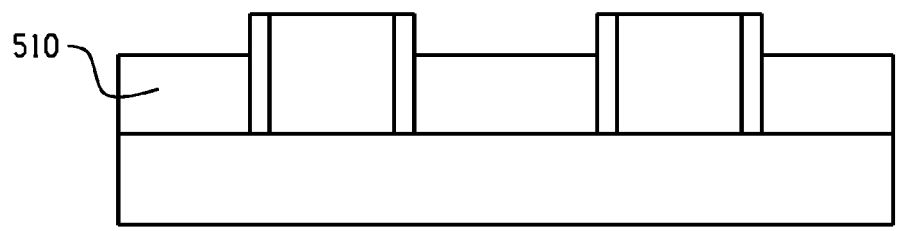
Figure 5D:
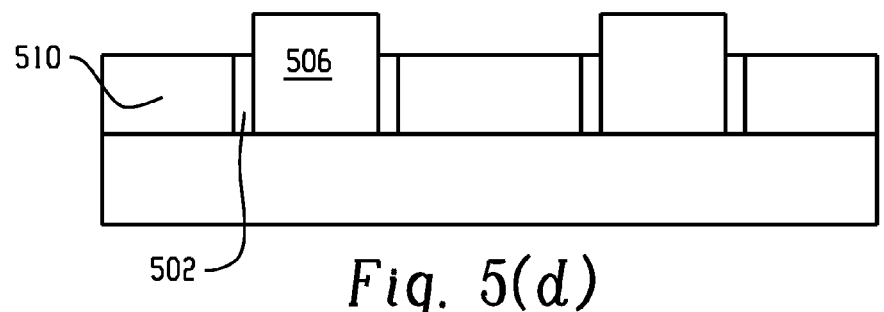
Figure 5E:
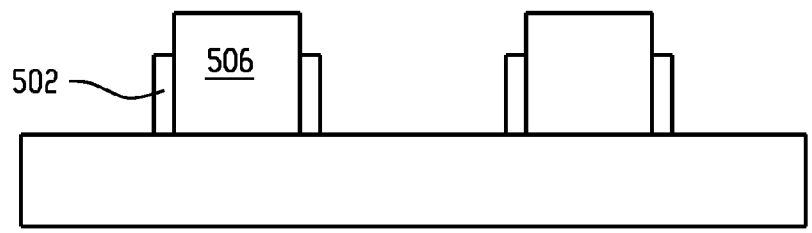
Figure 5F:
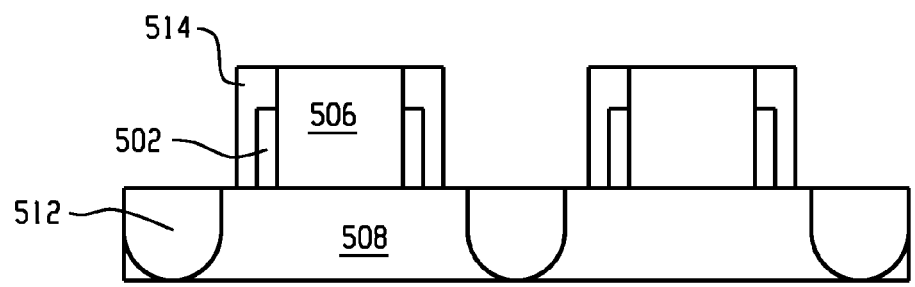
Figure 5G:
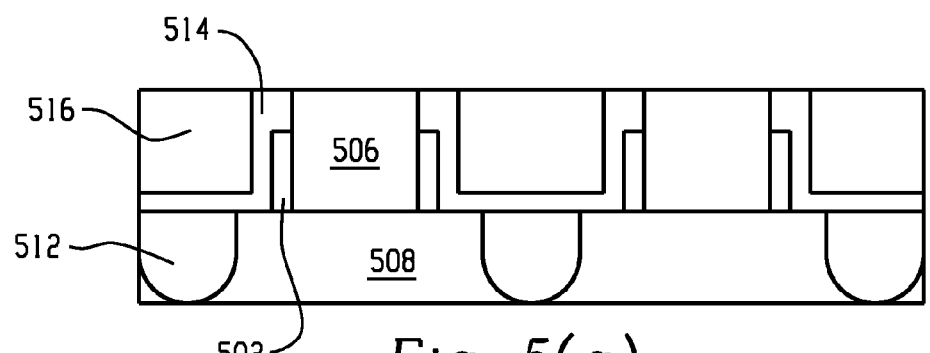

A different treatment of sidewall spacers is implemented in some embodiments, as shown in FIG. 5(a)-FIG. 5(g). A sidewall spacer 502 (e.g., SiOCN) is formed adjacent to a dummy polysilicon structure 506 over a substrate 508 (e.g., silicon), as shown in FIG. 5(a). A photo-resist layer 510 is formed, as shown in FIG. 5(b). Part of the photo-resist layer 510 is removed (e.g., through etching), as shown in FIG. 5(c). A selective etch is performed to remove a top part of the sidewall spacer 502, as shown in FIG. 5(d). As an example, an effective depth associated with the selective etching is in a range of about 25 nm to about 35 nm. Then, the photo-resist layer 510 is removed (e.g., through etching), as shown in FIG. 5(e). One or more junctions 512 are formed through an epitaxial-growth process, and a contact-etching-stop layer 514 is formed, as shown in FIG. 5(f). For example, the epitaxial-growth process includes a photolithography process to define the junctions 512, a recess process to remove part of the substrate 508, and a growth process to generate the junctions 512. Then, an inter-layer dielectric layer 516 is formed, as shown in FIG. 5(g).

Figure 6A:
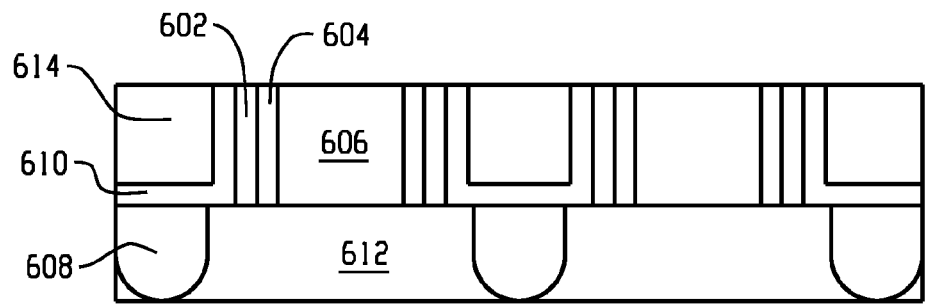
FIG. 6(a)-FIG. 6(g) depict example diagrams for fabricating a semiconductor structure including sidewall spacers according to certain embodiments.

FIG. 6(a)-FIG. 6(g) depict example diagrams for fabricating a semiconductor structure including sidewall spacers according to certain embodiments. As shown in FIG. 6(a), a sidewall spacer 604 (e.g., SiOCN) and a seal spacer 602 (e.g., SiCN or silicon nitride) are formed over a substrate 612 (e.g., silicon) next to each other. A dummy polysilicon structure 606 is adjacent to the sidewall spacer 604. An inter-layer dielectric layer 614 is formed over a CESL 610 that is formed over a junction 608 (e.g., n-doped or p-doped).

Figure 6B:
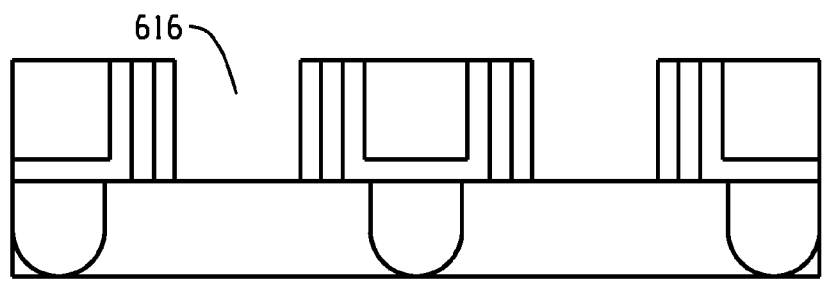
Figure 6C:
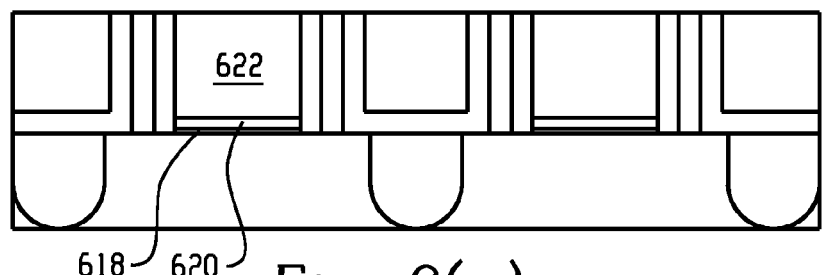
Figure 6D:
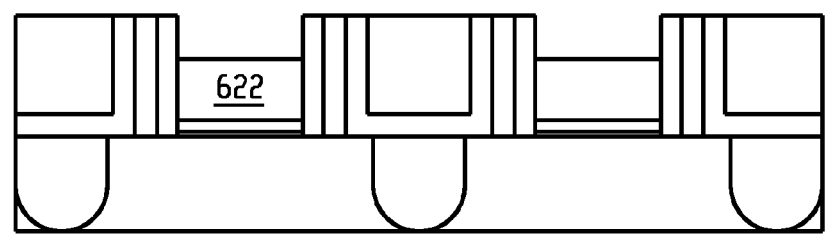
Figure 6E:
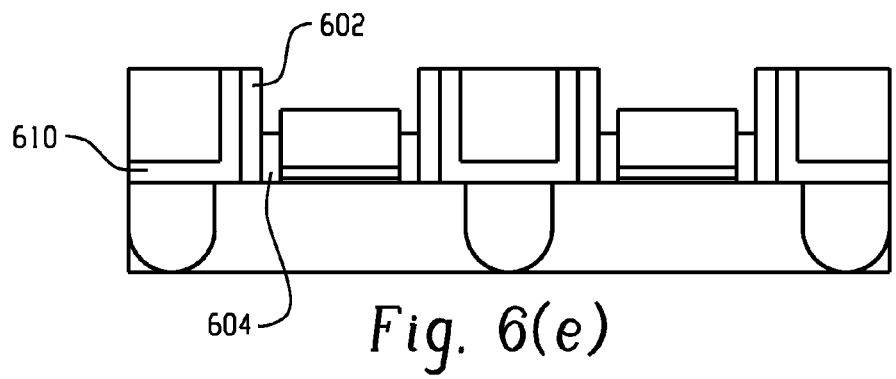
Figure 6F:
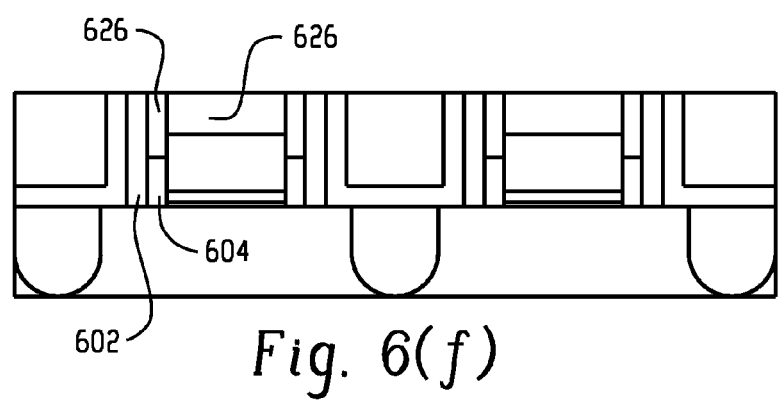

As shown in FIG. 6(b), the dummy polysilicon structure 606 is removed (e.g., through etching) to form a gate cavity 616. Then, a gate stack including an interfacial layer 618 (e.g., silicon oxide), a high-k dielectric layer 620 (e.g., hafnium oxide), and a gate electrode 622 (e.g., metal-based materials) is formed in the gate cavity 616, as shown in FIG. 6(c). An etching process is performed to reduce the height of the gate electrode 622, as shown in FIG. 6(d). A selective etch is performed to remove a top part of the sidewall spacer 604, as shown in FIG. 6(e). A sacrificial layer 626 (e.g., silicon nitride) is formed, and a CMP process is performed to remove part of the sacrificial layer 626, as shown in FIG.

Figure 6G:
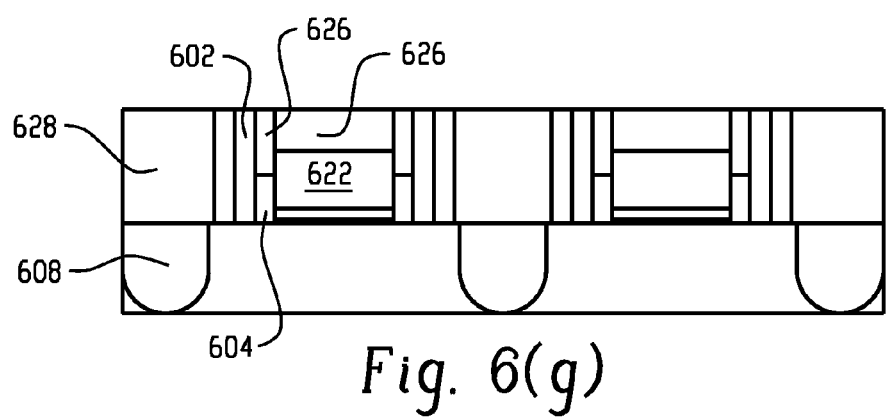

6(f). Then, a self-aligned-contact process is carried out to form one or more contacts 628 over source/drain regions of transistors, as shown in FIG. 6(g).

FIG. 7 depicts an example flow chart for fabricating a semiconductor structure including sidewall spacers. At 702, a gate structure is formed over a substrate. At 704, a first sidewall spacer is formed adjacent to the gate structure, the first sidewall spacer including a first dielectric material. At 706, a second sidewall spacer is formed adjacent to the first sidewall spacer, the second sidewall spacer including a second dielectric material. At 708, a gate stack is formed to replace the gate structure. At 710, the first dielectric material in a top part of the first sidewall spacer is changed to a third dielectric material.

In some embodiments, the first dielectric material includes silicon-oxygen-carbon-nitride. The second dielectric material includes silicon-carbon-nitride or silicon nitride. The third dielectric material includes silicon-carbon-nitride or silicon nitride. The first dielectric material in the top part of the first sidewall spacer is changed to the third dielectric material through plasma nitridation or thermal nitridation. As an example, the gate structure includes a dummy polysilicon gate structure. The gate stack includes: an interfacial layer formed over the substrate, a high-k dielectric layer formed over the interfacial layer, and a gate electrode formed over the high-k dielectric layer.

FIG. 8 depicts another example flow chart for fabricating a semiconductor structure including sidewall spacers. At 802, a gate structure is formed over a substrate. At 804, a first sidewall spacer is formed adjacent to the gate structure, the first sidewall spacer including a first dielectric material. At 806, a second sidewall spacer is formed adjacent to the first sidewall spacer, the second sidewall spacer including a second dielectric material. At 808, a top part of the first sidewall spacer is removed. At 810, a dielectric layer is formed over the first sidewall spacer, the dielectric layer including a third dielectric material.

In some embodiments, the first dielectric material includes silicon-oxygen-carbon-nitride, and the second dielectric material includes silicon-carbon-nitride or silicon nitride. The third dielectric material includes silicon nitride. For example, the gate structure includes a dummy polysilicon gate structure. In another example, the gate structure includes: an interfacial layer formed over the substrate, a high-k dielectric layer formed over the interfacial layer, and a gate electrode formed over the high-k dielectric layer. As an example, the top part of the first sidewall spacer is removed through selective etching.

This written description uses examples to disclose embodiments of the disclosure, include the best mode, and also to enable a person of ordinary skill in the art to make and use various embodiments of the disclosure. The patentable scope of the disclosure may include other examples that occur to those of ordinary skill in the art. One of ordinary skill in the relevant art will recognize that the various embodiments may be practiced without one or more of the specific details, or with other replacement and/or additional methods, materials, or components. Further, persons of ordinary skill in the art will recognize various equivalent combinations and substitutions for various components shown in the figures. For example, certain transistors are described herein as examples, and the concepts, structures, layouts, materials, or operations may also be applicable to other types of semiconductor devices, such as bipolar junction transistors, diodes, capacitors, etc. As an example, the structures, layouts, materials, operations, voltage levels, or current levels related to "source" and "drain" described herein (including in the claims) may be interchangeable as a result of transistors with "source" and "drain" being symmetrical devices.

Well-known structures, materials, or operations may not be shown or described in detail to avoid obscuring aspects of various embodiments of the disclosure. Various embodiments shown in the figures are illustrative example representations and are not necessarily drawn to scale. Particular features, structures, materials, or characteristics may be combined in any suitable manner in one or more embodiments. The present disclosure may repeat reference numerals and/or letters in the various examples, and this repetition is for the purpose of simplicity and clarity and does not in itself dictate a relationship between the various embodiments and/or configurations discussed. Various additional layers and/or structures may be included and/or described features may be omitted in other embodiments. For example, a particular layer described herein may include multiple components which are not necessarily connected physically or electrically. Various operations may be described as multiple discrete operations in turn, in a manner that is most helpful in understanding the disclosure. However, the order of description should not be construed as to imply that these operations are necessarily order dependent. In particular, these operations need not be performed in the order of presentation. Operations described herein may be performed in a different order, in series or in parallel, than the described embodiments. Various additional operations may be performed and/or described. Operations may be omitted in additional embodiments.

This written description and the following claims may include terms, such as top, bottom, over, first, second, etc. that are used for descriptive purposes only and are not to be construed as limiting. The embodiments of a device or article described herein can be manufactured, used, or shipped in a number of positions and orientations. For example, terms designating relative vertical position may refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and may still fall within the meaning of the term "top." The term "over" as used herein (including in the claims) may not necessarily indicate that a first layer/structure "over" a second layer/structure is directly over and in immediate contact with the second layer/structure unless such is specifically stated; there may be one or more third layers/structures between the first layer/structure and the second layer/structure. The term "in" used herein (including in the claims) for a situation where a device/component is fabricated "in" a layer/structure does not indicate that all parts of the device/component are completely contained inside the layer/structure unless such is specifically stated; there may be one or more parts of the device/component exist outside of the layer/structure. The term "substrate" used herein (including in the claims) may refer to any construction comprising one or more semiconductive materials, including, but not limited to, bulk semiconductive materials such as a semiconductive wafer (either alone or in assemblies comprising other materials thereon), and semiconductive material layers (either alone or in assemblies comprising other materials). The term "semiconductor structure" used herein (including in the claims) may refer to shallow trench isolation features, poly-silicon gates, lightly doped drain regions, doped wells, contacts, vias, metal lines, or other types of circuit patterns or features to be formed over a semiconductor substrate. In addition, the term "semiconductor structure" used herein (including in the claims) may refer to various semiconductor devices, including transistors, capacitors, diodes, etc.

What is claimed is:

1. A semiconductor structure comprising:
   a substrate; and
   a transistor device comprising:
   a gate structure comprising an interfacial layer, a high-k dielectric layer, and a gate electrode formed over the substrate;
   a first sidewall spacer extending from the substrate, having a side part that has an arc-shaped edge and that is arranged at a height lower than the gate structure, and in contact with the gate structure, the first sidewall spacer further having a top part on which a nitridation process is performed; and
   a second sidewall spacer arranged adjacent to the first sidewall spacer, extending from the substrate, covering the arc-shaped edge of the first sidewall spacer, including a dielectric material, and having a height greater than the gate structure;
   wherein a height of the gate structure ranges from 25 to 50 nm,
   wherein a height of the side part of the first sidewall spacer ranges from 15 to 25 nm; and
   wherein the height of the side part of the second sidewall spacer ranges from 10 to 30 nm greater than the height of the gate structure.

2. The semiconductor structure of claim 1, wherein the second sidewall spacer is configured to protect the first sidewall spacer from one or more etching processes.

3. The semiconductor structure of claim 1, wherein the interfacial layer is formed over the substrate; and the high-k dielectric layer is formed over the interfacial layer, wherein the gate electrode is formed over the high-k dielectric layer.

4. The semiconductor structure of claim 3, wherein the interfacial layer includes silicon oxide.

5. The semiconductor structure of claim 3, wherein the high-k dielectric layer includes tantalum oxide, hafnium oxide, zirconium oxide, titanium oxide, aluminum oxide, hafnium silicates, or hafnium dioxide-alumina alloy.

6. The semiconductor structure of claim 3, wherein the gate electrode includes titanium, titanium nitride, titanium-aluminum, aluminum, aluminum nitride, tantalum, tantalum nitride, tantalum carbide, tantalum carbonitride, tantalum silicon nitride, or tantalum silicide.

7. The semiconductor structure of claim 1, wherein the top part of the first sidewall spacer includes silicon-carbon-nitride or silicon nitride.

8. The semiconductor structure of claim 1, wherein the dielectric material of the second sidewall spacer includes silicon-carbon-nitride or silicon nitride.

9. The semiconductor structure of claim 1, wherein the gate structure includes a dummy polysilicon gate structure.

10. The semiconductor structure of claim 1, wherein a width of the first sidewall spacer ranges from 2 to 5 nm.

11. The semiconductor structure of claim 1, further comprising a sacrificial layer disposed over the gate electrode of the gate structure defining a thickness, wherein the thickness of the sacrificial layer ranges from 10 to 30 nm.

12. The semiconductor structure of claim 1, wherein a height of the second sidewall spacer ranges from 35 to 80 nm.

13. The semiconductor structure of claim 1, further comprising a contact etch stop layer in contact with an outer surface of the second sidewall spacer.

14. A semiconductor structure comprising:
    a substrate;
    a gate structure comprising an interfacial layer, a high-k dielectric layer, and a gate electrode formed over the substrate;
    a first sidewall spacer extending from the substrate, having a side part that has an arc-shaped edge and that is arranged at a height lower than the gate structure and in contact with the gate structure, the bottom part of the first sidewall spacer including a first dielectric material with a dielectric constant lower than 4, the first sidewall spacer further having a top part on which a nitridation is performed; and
    a second sidewall spacer laterally arranged over the first sidewall spacer, extending from the substrate, covering the arc-shaped edge of the first sidewall spacer, and having a height greater than the gate structure;
    wherein a width of the first sidewall spacer ranges from 2 to 5 nm,
    a height of the second sidewall spacer ranges from 35 to 80 nm; and
    wherein the height of the side part of the second sidewall spacer ranges from 10 to 30 nm greater than the height of the gate structure.

15. The semiconductor structure of claim 14,
    wherein the second sidewall spacer is configured to protect the first sidewall spacer from one or more etching processes, and
    wherein the first dielectric material of the bottom part of the first sidewall spacer includes silicon-oxygen-carbon-nitride.

16. The semiconductor structure of claim 14, wherein
    a height of the gate electrode ranges from 25 to 50 nm, and
    a height of a bottom part of the first sidewall spacer ranges from 15 to 25 nm.

17. The semiconductor structure of claim 14, further comprising a sacrificial layer disposed over the gate electrode of the gate structure defining a thickness, wherein the thickness of the sacrificial layer ranges from 10 to 30 nm, and a height of the second sidewall spacer ranges from 35 to 80 nm.

18. The semiconductor structure of claim 14, further comprising a contact etch stop layer in contact with an outer surface of the second sidewall spacer.

* * * * *